United States Patent [19]

Ishida et al.

[11] Patent Number: 4,732,798

[45] Date of Patent: Mar. 22, 1988

[54] MULTILAYER CERAMIC SUBSTRATE AND METHOD OF MAKING THE SAME

[75] Inventors: Toru Ishida, Hirakata; Yasuharu Kikuchi, Moriguchi; Tatsurou Kikuchi, Kyoto; Yasuhiko Horio, Osaka, all of Japan

[73] Assignee: Matsushita Electric Industrial Co., Ltd., Osaka, Japan

[21] Appl. No.: 898,892

[22] Filed: Aug. 21, 1986

Related U.S. Application Data

[63] Continuation of Ser. No. 651,032, Sep. 14, 1984, abandoned.

[30] Foreign Application Priority Data

| Sep. 16, 1983 | [JP] | Japan | 58-171510 |
|---|---|---|---|
| Oct. 18, 1983 | [JP] | Japan | 58-194627 |
| Feb. 13, 1984 | [JP] | Japan | 59-24801 |
| Feb. 23, 1984 | [JP] | Japan | 59-31472 |
| Feb. 23, 1984 | [JP] | Japan | 59-31471 |
| May 15, 1984 | [JP] | Japan | 59-96869 |

[51] Int. Cl.⁴ .................................................. B32B 3/00
[52] U.S. Cl. ......................................... 428/137; 428/209; 428/432; 428/901
[58] Field of Search ............... 428/432, 209, 688, 689, 428/137, 131

[56] References Cited

U.S. PATENT DOCUMENTS

| 3,372,058 | 5/1968 | Boyd et al. | 428/328 |
|---|---|---|---|
| 3,827,891 | 8/1974 | Larry | 428/328 P X |
| 4,168,344 | 9/1979 | Shapiro et al. | 428/328 X |
| 4,283,243 | 8/1981 | Andreades et al. | 428/137 X |
| 4,465,727 | 8/1984 | Fujita et al. | 428/901 X |
| 4,490,429 | 12/1984 | Tosaki et al. | 428/210 X |

*Primary Examiner*—Nancy A. B. Swisher
*Attorney, Agent, or Firm*—Wenderoth, Lind & Ponack

[57] ABSTRACT

The present invention relates to a base metal conductor multilayered substrate capable of being integral with thick film components such as thick film resistors and to a method for producing such substrate.

12 Claims, 7 Drawing Figures

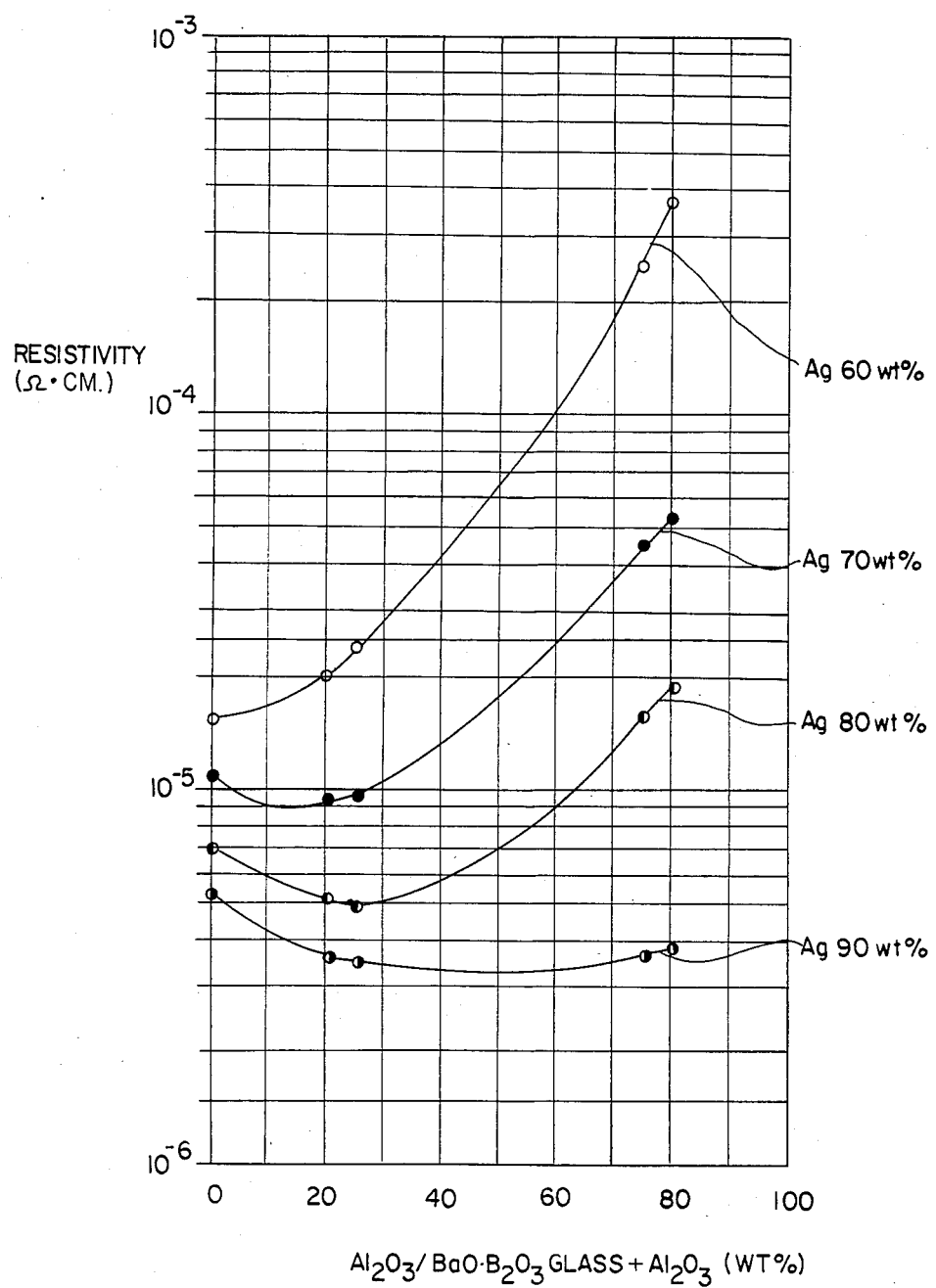

4,732,798

MULTILAYER CERAMIC SUBSTRATE AND METHOD OF MAKING THE SAME

This application is a continuation of now abandoned application Ser. No. 651,032, filed Sept. 14, 1984, now abandoned.

BACKGROUND OF THE INVENTION

1. Field of the Invention

This invention relates to a base metal conductor multilayered substrate capable of being integral with thick film components such as thick film resistors, and to a manufacturing method for the substrate.

2. Description of the Prior Art

Conventionally, a ceramic base metal conductor multilayered substrate in alumina-tungsten series, or alumina-molybdenum series, has been well-known, and has been widely used as packages for IC or LSI. On the other hand, a ceramic multilayered structure in this series has also been used as the multilayered substrate for packaging multipin semiconductors. In this case, the multilayered substrate mainly comprises the uppermost plated layer and parts subjected to wire bonding or soldering.

Recently, in the growing demand for miniaturization of apparatus, small-sized modularization and automatic adjustment of circuits have been required so that the substrate having a multilayer wiring structure and capable of being integral with thick film parts, such as thick film resistors, has been highly in demand. Such substrate, however, becomes oxidized in atmospheric air at a high temperature because its conductor is formed of tungsten or molybdenum and restricted in the chemical property. Therefore, it has been difficult to form thick film glaze resistors required to be sintered in air at a high temperature.

SUMMARY OF THE INVENTION

An object of the invention is to provide a multilayered substrate suitable for integration of internal base metal conductors and thick film components and a manufacturing method for the substrate. Hence, the invention aims at obtaining a packaging substrate higher in wiring density, integral with the thick film resistors, capable of being subjected to trimming by a laser, and being small-sized in a circuit module. Also, while it is possible to connect the internal base metal conductor layers electrically with the surface layer through orifices, the internal base metal conductor layers are structurally not oxidized even in air at a high temperature, whereby the substrate of multilayered wiring construction is expected to enable formation of a thick film in air at high temperature.

The multilayered substrate of the invention, which is designed to attain the above object, comprises electrical insulating layers of ceramic and internal conductor layers provided between each two layers of said insulating layers to form a laminated body, a uppermost layer of the electrical insulating layers being provided with orifices through which the internal conductor layers are exposed at necessary portions, the orifices being filled with a filler material comprising metal oxide chemically inert with respect to the internal base metal conductor and noble metal so as to cut off dispersion of oxygen in air at a high temperature.

Furthermore, the substrate may comprise noble metal series thick film conductors connected electrically to extended portions of the filler and thick film components such as thick film resistance elements using said thick film conductors as electrodes thereof.

The multilayered substrate of the invention constructed as above is producible in a method comprising the steps of: forming a sheet comprising a powder containing alumina as a main constituent and an organic binder; printing a conductive paste comprising a base metal powder, an organic binder and a vehicle on said sheet; printing an insulating paste comprising a powder containing alumina as a main constituent, an organic binder and a vehicle on said sheet; repeating said printing steps alternately thereby to form a multilayered structure body, the uppermost layer being an insulating layer; baking said multilayered structure body; filling in orifices provided on said uppermost layer a filler paste comprising an oxide powder of low melting point which is chemically inert to said base metal, a noble metal powder, an organic binder and a vehicle; and baking said filler paste in air.

The base metal powder is preferably tungsten powder or molybdenum powder.

The above and other objects and features of the invention will be more apparent from the following detailed description taken in connection with the accompanying drawings.

BRIEF DESCRIPTION OF THE DRAWINGS

FIG. 3 is a graph showing the sheet resistivity of each film produced in such a manner that $BaO$-$B_2O_3$ series glass powder, alumina powder, silver powder, and an organic vehicle, are kneaded into paste, printed onto an alumina substrate, dried and then baked in air at a temperature of 850° C.;

DESCRIPTION OF THE PREFERRED EMBODIMENTS

Figure 1:
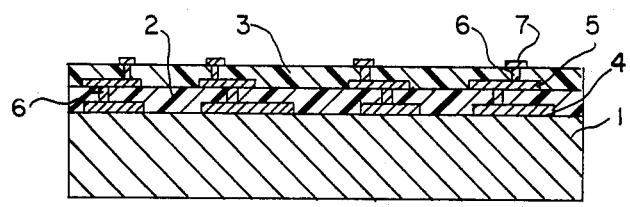
FIG. 1 is a sectional view of an embodiment of a multilayered substrate of the invention.

Explanation will be given on construction of the multilayered substrate of the invention in accordance with the drawings. Referring to FIG. 1, reference numerals 1, 2 and 3 designate insulating layers of ceramic, 4 and 5 designate base metal conductor layers, 6 designates a via hole perforating the insulating layer 2 and connecting the upper and lower conductor layers, and 7 designates a filler comprising metal oxide chemically inert to the base metal and noble metal and filled into each orifice provided at the uppermost insulating layer.

In FIG. 1, the multilayer structure, when no filler is made, cannot be sintered in air because of base metal conductor layer. Hence, such structure is produced in such a manner that a plurality of green sheets comprising ceramic powder and organic binder, such as polyvinyl butyral, and printed with base metal conductive paste, are in layers and integrally stuck under the heat and pressure, or base metal conductive paste and insulating paste of the same component as the green sheet, are subjected to alternately repeated printing and drying by use of, for example, screen printing so as to be multilayered, and baked in a mixed gas of nitrogen or nitrogen-hydrogen. Such structure is of densified structure, whereby the base metal conductor layers embedded into the multilayered structure baked under the above condition, even when subjected to the heat treatment in air at a high temperature, will cut off passage of oxygen through the ceramic insulating layer so as to be protected from oxidization. In other words, the multilayered structure except for the orifices on the uppermost layer is made completely air-tight.

Figure 2:
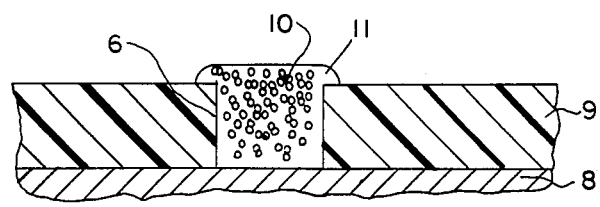
FIG. 2 is an enlarged sectional view of a filler filled into an orifice and the vicinity thereof in the FIG. 1 embodiment.

This invention aims at obtaining a construction such that it is possible to electrically connect the internal base metal conductor layers with the uppermost layer through the orifices and the internal base metal is not oxidized even in air at a high temperature. As a result, the thick films formed in air at a high temperature can be built-up on the substrate of multilayered construction for wiring. The reason for realizing the above will be described with reference to FIG. 2, in which reference numeral 8 designates a base metal conductor layer, 9 designates an uppermost insulating layer, 10 designates noble metal particles, and 11 designates a metal oxide phase chemically inert to the base metal. A mixture of noble metal particles and metal oxide may obtain electric conduction or not. When the noble metal particles are completely separated from each other and dispersed in the metal oxide, such mixture phase is extremely high in electric resistance, or in an electrical insulating phase. On the other hand, when the noble metal particles are dispersed in a manner of adopting a certain aggregate construction in the metal oxide, the noble metal particles are continuously brought into contact with each other to thereby obtain the electrical conduction, which is shown in FIG. 2. It is necessary for obtaining such noble metal aggregate to develop the fluidity in part of the component of metal oxide during the heat treatment process for making the filler. In other words, the fluidity in part of the metal oxide enables the noble metal particles to move in the metal oxide. On the other hand, generally, fine particles are subjected to a force intended to reduce its surface energy, whereby the noble metal powder in the metal oxide having the fluidity tends to be of aggregate construction. In order to fully raise the electrical conductivity in such series, an amount of noble metal particles in the metal oxide is preferred to be larger to some extent, the amount of noble metal particles being preferably at least 60 or more weight %.

Now, the metal oxide of the invention comprises the component chemically inert to the base metal conductor. Conversely, in case that the metal oxide contains, for example, lead monooxide (PbO), the following reaction occurs:

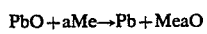

$$PbO + aMe \rightarrow Pb + Me_aO$$

where Me represents an internal conductor metal element.

Hence, the base metal conductor layers are oxidized to be insulating material. Accordingly, when the metal oxide of the invention is used, the electrical conduction, even when subjected to the heat treatment, is maintained without chemically changing the base metal conductor layer. For example, in the case where the internal base metal conductor is made from the element W, Mo, Fe, Ni or Cu, or the metal oxide, such as $Al_2O_3$, BaO, $B_2O_3$, $SiO_2$, CaO MgO, $Na_2O$, $Ta_2O_5$ or $Nb_2O_5$, an oxidation or reduction reaction on the above elements does not occur. In the construction of the invention, such oxide series component plays an important role for keeping the base metal of internal conductor air tight against the atmosphere. In other words, the component of this metal oxide is important to improve the adhesion at the interface between the filler and the uppermost insulating layer and keep airtightness therebetween. The reason for the above is based on the fact that the metal oxides are superior in wettability with each other. Also, in the invention, the metal oxide in the filler will strictly keep the adhesion with the insulating layer around the filler, resulting the atmosphere being interrupted from entering into the multilayered structure. On the other hand, assuming that the filler comprises, for example, noble metal only, the adhesion of noble metal to the ceramic insulating layer is weak so as not to keep the airtightness to the atmosphere. When the noble metal is an such as silver, the diffusion coefficient of oxygen in silver is larger, so that when the multilayer structure using only a filler of silver and having the base metal internal conductor is heat-treated in air at a high temperature, the internal conductor layer is oxidized. Also, a filler composed of noble metal only is weak in adhesion to the ceramic layer therearound and the filler and ceramic layer are largely different in coefficient of thermal expansion, thereby creating a crack at the interface due to the heat treatment or the like, so as not to simultaneously maintain airtightness at the same.

In spite of the above defect, the noble metal has been used because it essentially is not oxidized even in air at a high temperature and also is kept electrically conductive even when subjected to the heat treatment in air at a high temperature. Such noble metal element is silver, gold, platinum, palladium, etc.

As abovementioned, the filler comprising noble metal and metal oxide chemically inert to the base metal conductor layer, is filled into the orifices at the uppermost layer of the multilayered substrate comprising the base metal conductor layers and ceramic insulating layers, whereby the internal conductor layers and the uppermost layer are electrically connected through the filler, and the substrate, even when subjected to the heat treatment in air at a high temperature, is not oxidized and enables maintenance of function as the multilayered wiring structure. Hence a, thick film paste of silver-palladium conductor or ruthenium dioxide series resistor, is printed onto such multilayered structure and then is dried and baked in air at a temperature of about 850° C., thereby enabling the multilayered substrate of integral thick film type to be produced.

Next, an explanation will be given on the manufacturing method for the multilayered substrate of the invention. This is a laminated body, as for the internal conductor and ceramic for the insulating layer. The multilayered substrate, as abovementioned, is produced in such a manner that an unbaked structure in layers produced by repeatedly printing the base metal paste and insulating paste onto a ceramic green sheet comprising ceramic powder and organic binder, or a structure in layers comprising a plurality of green sheets printed with base metal paste and integrated with each other under heating and pressure, is sintered in a neutral or reducing atmosphere.

The multilayered substrate of the invention is obtained in such a manner that the paste comprising noble metal conductor, metal oxide powder chemically inert to the internal conductor, and organic binder such as ethyl cellulose, which are kneaded with vehicles dissolved in an organic solvent such as turpentine oil, is filled by use of screen printing into the orifices formed onto the uppermost layer at the multilayered structure produced as above so as to expose the internal conductor through each orifice, and the paste is dried and is then subjected to the heat treatment in air at a temperature of about 800° to 900° C. In this case, it is to be noted that for filling the filler, the metal oxide chemically inert to the internal conductor plays an important role. It is important for materialization of function of the invention to allow part of metal oxide used in the filler to have liquidity during the temperature rise for the heat treatment. The filler, after being filled in pasting condition, is not densified so that external oxygen, during the heat treatment, passes through the filler to reach the internal base metal conductor layer. Accordingly, it is important for the metal oxide of the invention to develop liquidity at the beginning of the oxidation in the internal conductor layer due to the oxygen entering therein through the filler. In other words, the orifices printed with the aforesaid filler will develop the following phenomena with temperature rise, thereby enabling formation of the filler of the invention in the orifices:

(1) The organic binder in the filler is thermaldecomposed or combines with oxygen to dissipate as hydrocarbon gas, CO, or $CO_2$, to exterior.

(2) The base metal conductor is somewhat oxidized at the surface thereof.

(3) Part of metal oxide in the filler begins to flow.

(4) The surface of base metal conductor begins to be wet with fluid of metal oxide and then the base metal conductor layer as a whole is covered by the metal oxide, where since the surface of base metal conductor layer is previously somewhat oxidized, an affinity for the fluid of metal oxide increases so as to be effective in promotion of wetting. After this time, even when temperature rises due to the heat treatment, the base metal conductor layer is covered by the metal oxide chemically inert thereto, whereby oxygen in an external atmosphere of air is cut off by the metal so as not to promote oxidization in the base metal conductor layer.

(5) The metal oxide forms therein the aggregate of noble metal powder and is densified as a whole, in which the metal oxide and ceramic insulating layer are closely integral with each other. Since the metal oxide is chemically inert to the internal base metal conductor, there is no fear that the base metal conductor is oxidized to be not conductive.

(6) The filler is frozen in densified condition in the process of returning from the maximum temperature for heat treatment to a room temperature.

Next, an example of concrete construction will be detailed.

In consideration of a multilayered structure comprising an internal conductor of tungsten or molybdenum and an insulating ceramic of alumina, there is employed a sintered body of tungsten or molybdenum having the property of being oxidizable in air at a temperature of about 500° C. and rapidly becoming oxidized at a temperature range from 700° to 800° C. to form $WO_3$ or $MoO_3$ and thereby sublimate. Hence, in a case of this series, the metal oxide used in the filler should have the property of developing the fluidity at a temperature of about 500° C. A metal oxide material which develops the fluidity at such temperature and is chemically inert to tungsten or molybdenum includes the $BaO-B_2O_3$ series glass, $ZnO-B_2O_3-SiO_2$ series glass, etc., among which the $BaO-B_2O_3$ series glass is the most effective as the low temperature fluid oxide in the filler.

This multilayered structure lastly needs integration with the thick films, the thick film material generally including an Ag-Pd conductor or ruthenium oxide series glaze-resistor film. A paste film is formed onto the alumina sintered substrate by screen printing and, after dried, is baked at a temperature of 800° C. to 850° C.

Now, the multilayered structure of the invention should sufficiently durable even when subjected to thermal hysteresis at a temperature of 800° to 850° C. during the formation of thick film. Therefore, when the aforesaid metal oxide is softened at a temperature of about 500° C., the filler itself will be softened each time it is heated, so that the structure becomes inconvenient from the viewpoint of durability against the heat treatment. Hence, the present invention uses a mixture of glass to be softened at a low temperature and material functioning to raise the softening point of glass as the metal oxide for the filler, thereby realizing the thermal stability of filler. For a glass softening point raising material, the component soluble in the low softening point glass sufficiently at a temperature of 800° to 850° C. is preferable. For example, for $BaO-B_2O_3$ series glass, the most suitable low melting point component of the filler for the structure in layers of alumina-tungsten or alumina-molybdenum series, is alumina powder which is added to the filler paste to be effective in improvement in stability of filler after being filled. In this case, the composition ratio effective for $BaO-B_2O_3$ series glass/$Al_2O_3$=⅛−4/1 in weight ratio, preferably, a range of ⅜ to 3/1 is obtainable for the desired effect. In this case, if the amount of $BaO-B_2O_3$ series glass is too much, the filler lacks thermal stability. On the other hand, if the amount of $Al_2O_3$ is too much, the screening effect at the base metal conductor surface by the metal oxide cannot be observed. From the viewpoint of electrical conductivity of the filler, a composition ratio of metal oxide to noble metal in the filler, when the noble metal is silver, is effective in a range of metal oxide/silver<⅜−1/9 in weight ratio, preferably, a range of 3/7−¼ an obtain the desired effect. When the noble metal is gold, the ratio in a range of ⅓−1/32 in weight ratio is effective, preferably that of 1/12−1/7 is desirable. When the noble metal is platinum, a range of ⅓−1/32 is effective, preferably that of 1/12−1/7 is more effective. When the noble metal is palladium, a range of ⅜−1/9 is effective, preferably, that of 3/7−¼ can obtain the desired result. In this case, if the ratio of metal oxide is too large, the electrical conductivity varies to the lower value and if an amount of noble metal is too large, the screening effect with respect to the surface oxidation of base metal is reduced and the thermal stability becomes poor. Referring to FIG. 3, a typical example of the filler having a sufficiently high electrical conductivity in the above composition ranges is shown, in which the relation between the resistivity and the composition after the silver powder, BaO-B$_2$O$_3$ series glass powder, alumina powder, and vehicles are kneaded, screen-printed on 96% alumina sintered substrate, dried, and baked at 850° C. in the air by use of a belt furnace. As seen from FIG. 3, it is understandable that the electric conductivity of filler is high enough in the above composition range, because each orifice at the uppermost ceramic insulating layer of the multilayered structure of the invention is usually a square of 0.4 mm×0.4 mm in opening area and about 50 μm in depth.

Electric resistance from the internal conductor layer to the uppermost layer through the filler in this dimension is given by $$R = \rho \times \frac{l}{s} = \rho \times \frac{0.005}{(0.04)^2} = \rho \times 3.125,$$

where
s: the opening area of orifice at the uppermost layer
l: the depth of the orifice.
and
ρ: the volume resistivity (Ω-cm) of the filler.

From the above, the resistance value is only three times the volume resistivity, of the filler, which is out of consideration for practical use.

Figure 4A:
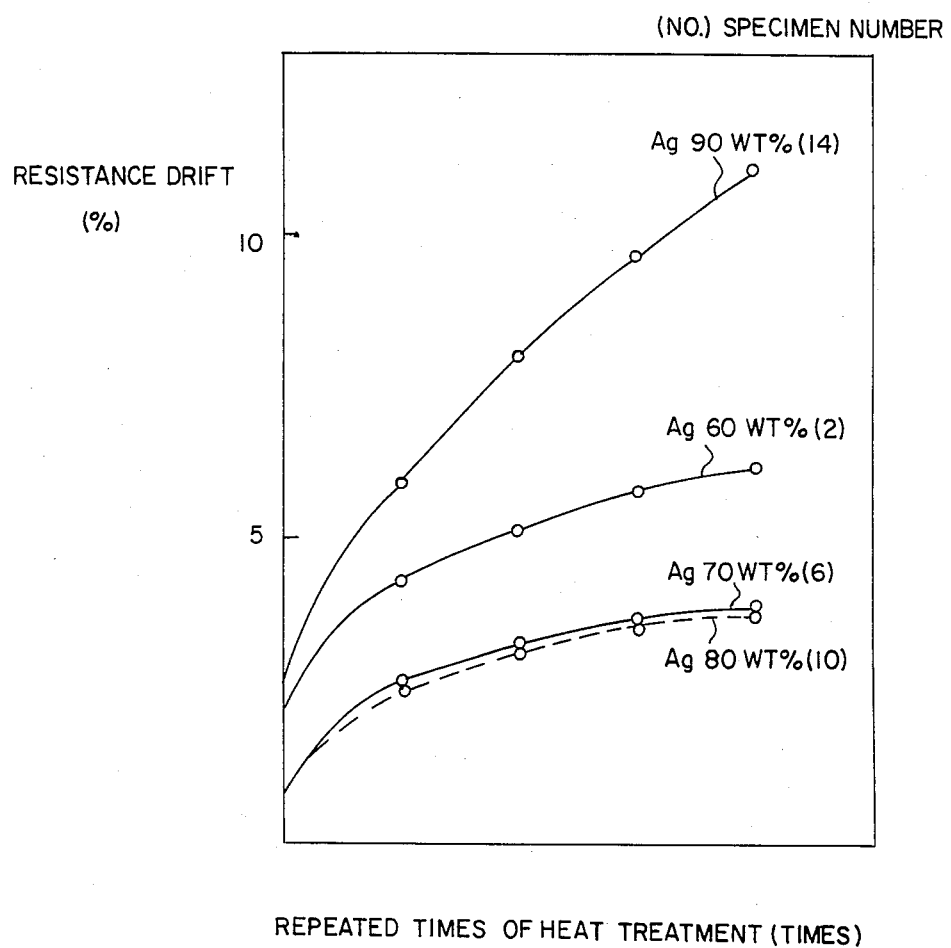
FIG. 4(a) is a graph showing variations in resistance value when the tungsten-alumina series multilayered substrate is filled in the orifices at the uppermost layer with a filler comprising $BaO$-$B_2O_3$ series glass, alumina powder, and silver powder, and subjected four times to the repeated heat treatments at a temperature of 850° C., in which the resistance values include those at the measuring terminals at an internal conductor layer because resistance at the interface between the filler and the internal conductor layer is very small.
Figure 4B:
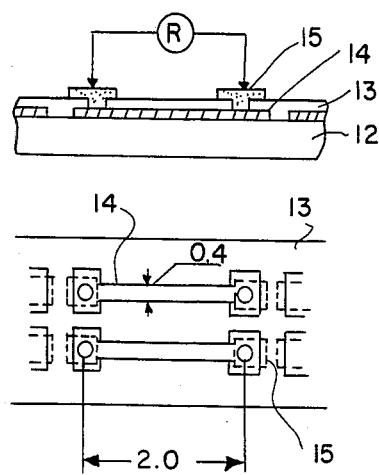
FIG. 4(b) is an illustration of a measuring method for characteristics shown in FIG. 4(a)

The aforesaid composition ranges are mainly restricted in point of the airtightness and heat resisting stability of the filler and formation thereof without oxidizing the internal conductor layers. FIG. 4(a) shows the stability in the heat treatment cycle for the tungsten-alumina series multilayered structure filled with the filler of typical composition, in which the stability is extremely high, the heat treatment being carried out by use of the belt furnace at a peak temperature of 850° C. As a result, since a specimen as shown in FIG. 4(b) is used, the resistivity includes that of part of internal conductor. In FIG. 4(b), reference numerals 12 and 13 designate alumina insulating layers, 14 designates a tungsten conductor, and 15 designates the filler.

Next, an explanation will be given of a case where the internal conductor is a low melting point base metal conductor of the element, such as copper.

The melting point of copper is 1083° C. so that when copper is used for the internal conductor, the multilayered structure comprising the ceramic insulating layer and copper should be sintered at a temperature less than 1083° C. Material for the insulating layer to be sintered at the above temperature includes, for example, B$_2$O$_3$-SiO$_2$-Al$_2$O$_3$ series glass or a mixture series thereof with Al$_2$O$_3$ powder. When the internal conductor is made of an element such as copper, a forming condition of filler filled into the orifices at the uppermost layer of multilayered structure should be taken into consideration from the viewpoint of temperature. In other words, in a case where a filler including silver or gold is formed in the orifices at the uppermost layer of multilayered structure comprising a internal copper conductor, since copper is eutectic with silver or gold, the temperature for formation of the filler should be lower than each eutectic temperature. The eutectic temperature for copper and silver is 779° C., and that for copper and gold 889° C. Therefore, the filler formation temperature, when silver is used for noble metal in the filler, should be selected to be less than 779° C., and when gold is used, less than 889° C. On the other hand, copper—platinum and copper—palladium have no eutectic point, so that consideration need not be taken particularly for the formation temperature. Accordingly, the use of silver for the filler cannot be said to be proper for integration of the filler with the thick film resistors required to be formed at a temperature of 800° to 850° C., but it is apparent that integration of filler with the thick film material to be formed at a temperature less than 779° C. is not inclusive. The metal oxide used in the filler is suitable for use as the material in the same series as the aforesaid case of using the internal conductor of tungsten or molybdenum. The reason for this is that the metal oxide includes in part the component softened at a temperature of 500° C. or less and copper is thermodynamically less oxidized by air in comparison with tungsten or molybdenum, thereby fully satisfying the requirements for completing the filler.

Next, an explanation will be given on examples of the invention.

EXAMPLE 1

The main component of alumina powder is added with silica (SiO$_2$), magnesium (MgO) and calcium oxide (CaO), the, alumina powder being weighed as a whole to be 96% in weight percentage. The alumina powder which is toluene isopropyl alcohol at 7 kg, plasticizer at and the additives at 20 kg, the organic solvent 0.8 kg, and polyvinyl butyral resin of 1.6 kg, are mixed in a ball mill to produce a slip. The slip, after being defoamed by a vacuum pump, is formed into a film by a doctor blade on a Mylar film and then is dried to obtain a sheet-like substance called the green sheet.

Now, a tungsten paste obtained by kneading tungsten powder and organic vehicle, and an insulating paste obtained by kneading the same inorganic component as the green sheet and organic vehicle, are subjected repeatedly to alternate printing and drying on the green sheet, thereby having obtained an unbaked structure in layers. The uppermost layer of the unbaked structure is an insulating unbaked layer, at the necessary portions of which are provided orifices through which the internal tungsten layer is exposed, the size of each orifice is 476 μm×476 μm, the insulating layer being about 50 μm in thickness. Hence, each orifice is square of 476 μm in the opening area and 50 mμ in depth. Such structure was sintered at a temperature of 1570° C. and in a reducing atmosphere of hydrogen of 13% and nitrogen of 87% and at the dew point temperature of 25° C., whereby a sintered multilayered structure composed of alumina-tungsten series was obtained. Filler paste was screen-printed to fill the orifices at the uppermost layer of the sintered structure and then dried, the filler paste comprising the noble metal powder, BaO-B$_2$O$_3$ series glass powder, alumina powder, and vehicle of ethyl cellulose at 10% dissolved in a terpentine oil, which are kneaded by triple rolls. The layered structure having the filler screen-printed was passed through the belt furnace in an atmosphere of air at peak temperature of 850° C., and of bell-like-shaped temperature profile, in which the time of passing the structure through the belt furnace was about 60 minutes.

The specimen obtained as the above was measured as to electric resistance through the filler, the electric resistance being measured through the fillers at both ends of internal conductors of 400 μm in width and 2 mm in length as shown in FIG. 4(b).

The composition of filler and the results of electric resistance measurement are shown in Tables 1 through 4, where sheet resistivity of the internal conductor is about 15 m $\Omega/\square$ and resistance value of the internal conductor is about 75 m$\Omega$, so that the resistance values shown in the tables include internal conductor resistance value of 75 m$\Omega$.

TABLE 1

| Specimen No. | Filler Composition (w. %) | | | Electric Resistance | |
|---|---|---|---|---|---|
| | Silver Powder | BaO—$B_2O_3$ Series Glass Powder | Alumina Powder | I(m$\Omega$) | II(m$\Omega$) |
| 1 | 60 | 32 | 8 | 75.13 | 79.29 |
| 2 | 60 | 30 | 10 | 75.15 | 79.88 |
| 3 | 60 | 10 | 30 | 76.57 | 81.02 |
| 4 | 60 | 8 | 32 | 77.28 | 84.18 |
| 5 | 70 | 24 | 6 | 75.06 | 77.09 |
| 6 | 70 | 22.5 | 7.5 | 75.06 | 78.00 |
| 7 | 70 | 7.5 | 22.5 | 75.29 | 79.18 |
| 8 | 70 | 6 | 24 | 75.34 | 79.85 |
| 9 | 80 | 16 | 4 | 75.03 | 77.04 |
| 10 | 80 | 15 | 5 | 75.03 | 77.92 |
| 11 | 80 | 5 | 15 | 75.10 | 78.10 |
| 12 | 80 | 4 | 16 | 75.12 | 78.18 |
| 13 | 90 | 8 | 2 | 75.23 | 82.40 |
| 14 | 90 | 7.5 | 2.5 | 75.22 | 83.60 |
| 15 | 90 | 12.5 | 7.5 | 75.23 | 84.82 |
| 16 | 90 | 12 | 8 | 75.23 | 85.23 |

TABLE 2

| Specimen No. | Filler Composition (w. %) | | | Electric Resistance | |
|---|---|---|---|---|---|
| | Gold Powder | BaO—$B_2O_3$ Powder | Alumina Powder | I(m$\Omega$) | II(m$\Omega$) |
| 17 | 75 | 20 | 5 | 75.46 | 82.50 |
| 18 | 75 | 18.75 | 6.25 | 75.49 | 82.69 |
| 19 | 75 | 6.25 | 18.75 | 77.19 | 84.51 |
| 20 | 75 | 5 | 20 | 77.69 | 85.54 |
| 21 | 86 | 11.2 | 2.8 | 75.27 | 78.66 |
| 22 | 86 | 10.5 | 3.5 | 75.28 | 78.89 |
| 23 | 86 | 3.5 | 10.5 | 75.34 | 79.25 |
| 24 | 86 | 2.8 | 11.2 | 75.36 | 79.50 |
| 25 | 92 | 6.4 | 1.6 | 75.21 | 78.50 |
| 26 | 92 | 6 | 2 | 75.20 | 78.53 |
| 27 | 92 | 2 | 6 | 75.19 | 78.60 |
| 28 | 92 | 1.6 | 6.4 | 75.20 | 79.01 |
| 29 | 97 | 2.4 | 0.6 | 75.16 | 82.23 |
| 30 | 97 | 2.25 | 0.75 | 75.16 | 83.01 |
| 31 | 97 | 0.75 | 2.25 | 75.16 | 84.29 |
| 32 | 97 | 0.6 | 2.4 | 75.16 | 85.48 |

TABLE 3

| Specimen No. | Filler Composition (w. %) | | | Electric Resistance | |
|---|---|---|---|---|---|
| | Platinum Powder | BaO—$B_2O_3$ Series Glass | Alumina Powder | I(m$\Omega$) | II(m$\Omega$) |
| 33 | 75 | 20 | 5 | 75.36 | 82.60 |
| 34 | 75 | 18.75 | 6.25 | 75.40 | 82.73 |
| 35 | 75 | 6.25 | 18.75 | 76.56 | 84.69 |
| 36 | 75 | 5 | 20 | 76.81 | 85.88 |
| 37 | 86 | 11.2 | 2.8 | 75.17 | 78.29 |
| 38 | 86 | 10.5 | 3.5 | 75.17 | 78.36 |
| 39 | 86 | 3.5 | 10.5 | 75.23 | 78.48 |
| 40 | 86 | 2.8 | 11.2 | 75.25 | 78.55 |
| 41 | 92 | 6.4 | 1.6 | 75.12 | 78.30 |
| 42 | 92 | 6 | 2 | 75.12 | 78.32 |
| 43 | 92 | 2 | 6 | 75.13 | 78.39 |
| 44 | 92 | 1.6 | 6.4 | 75.13 | 78.45 |
| 45 | 97 | 2.4 | 0.6 | 75.08 | 82.33 |
| 46 | 97 | 2.25 | 0.75 | 75.08 | 82.59 |
| 47 | 97 | 0.75 | 2.25 | 75.08 | 82.78 |
| 48 | 97 | 0.6 | 2.4 | 75.08 | 83.49 |

TABLE 4

| Specimen No. | Filler Composition (w. %) | | | Electric Resistance | |
|---|---|---|---|---|---|
| | Palladium Powder | BaO—$B_2O_3$ Series Glass | Alumina Powder | I(m$\Omega$) | II(m$\Omega$) |
| 49 | 60 | 32 | 8 | 77.0 | 84.18 |
| 50 | 60 | 30 | 10 | 77.3 | 84.68 |
| 51 | 60 | 10 | 30 | 100.0 | 112.35 |
| 52 | 60 | 8 | 32 | 110.0 | 114.68 |
| 53 | 70 | 24 | 6 | 75.86 | 79.01 |
| 54 | 70 | 22.5 | 7.5 | 75.88 | 79.12 |
| 55 | 70 | 7.5 | 22.5 | 78.88 | 82.09 |
| 56 | 70 | 6 | 24 | 80.00 | 84.22 |
| 57 | 80 | 16 | 4 | 75.53 | 78.89 |
| 58 | 80 | 15 | 5 | 75.53 | 79.20 |
| 59 | 80 | 5 | 15 | 76.69 | 80.41 |
| 60 | 80 | 4 | 16 | 77.25 | 81.21 |
| 61 | 90 | 8 | 2 | 75.46 | 82.03 |
| 62 | 90 | 7.5 | 2.5 | 75.46 | 82.29 |
| 63 | 90 | 2.5 | 7.5 | 75.48 | 83.08 |
| 64 | 90 | 2 | 8 | 75.56 | 83.48 |

The multilayered structure having the filler obtained as abovementioned aims at later formation of thick films of silver-palladium or of $RuO_2$ series glaze resistance and is important to have the stability in the thermal cycle in the condition of forming the thick films. The electric resistance II in each table represents a resistance value after the structure was passed four times through the belt furnace in an atmosphere of air at a temperature of 850° C. As is apparent from the above results, the electric resistance through the filler is extremely low so that the specimen has an electrical conductivity sufficient for practical use and is superior in the stability of the thermal cycle. Especially, specimens No. 5 to 12, 21 to 28, 37 to 44, and 53 to 60, exhibit properties superior in both the initial resistance value and thermal stability.

Figure 5:
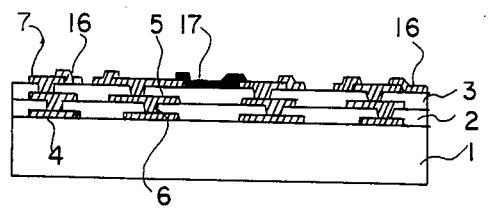
FIG. 5 is a sectional view of the multilayered substrate on which an Ag-Pd thick film conductors and $RuO_2$ series thick film resistors are in layers.

Next, the multilayered structure filled with the aforesaid filler was provided with thick films of silver-palladium and $RuO_2$ series glaze resistor. The process for the thick films comprises (1) printing and drying silver-palladium paste, (2) baking it in the belt furnace in air at a temperature of 850° C., (3) printing and drying $RuO_2$ glaze resistance paste, and (4) baking it in the belt furnace in air at a temperature of 850° C. FIG. 5 is a sectional view of the multilayered structure obtained as above, in which reference numeral 16 designates silver-palladium conductor films, and 17 designates $RuO_2$ series glaze resistance films. In addition, the silver-palladium conductor film is in contact with the filler formed at the uppermost layer of the multilayered structure and is connected with the internal conductor through the filler. The thick film formed as in the foregoing has exhibited characteristics quite equivalent to those of thick films formed at the substrate of the 96% sintered alumina as usual. Also, the $RuO_2$ resistant film has been subjected to trimming by means of the laser beam, in which the laser beam did not perforate the uppermost insulating layer because the laser beam perforated the insulating layer merely by less than 5 $\mu$m in depth from the surface, whereby the internal conductor was not at all affected by the beam. In this example, a multilayered structure has been obtained which has multilayered wiring construction and is formed on thick films which have the same characteristic as that of the thick films integrally formed on the usual alumina substrate. This multilayered structure can constitute electric circuits by soldering thereto chip capacitors, semiconductor devices, other chip parts and lead terminals.

EXAMPLE 2

This example uses molybdenum for the internal conductor. A multilayered structure of alumina component of 92% and internal conductor of molybdenum, was sintered under an atmosphere of $H_2$ at 13%, $N_2$ at 87%, at a temperature of about 1500° C., and of the dew point at a temperature of 20° C. A filler comprising noble metal powder, $BaO$-$B_2O_3$ series glass powder, alumina powder and organic vehicle, was filled by screen printing into orifices on the uppermost insulating layer at the multilayered structure. Such structure was passed through and baked by the belt furnace at a peak temperature of 850° C., of bell-like-shaped temperature profile, and in an atmosphere of air, in which the total time for baking was about 60 minutes. Electrical conductivity of filler was measured under the same condition as Example 1 and the internal conductor was 0.4 mm in width, 2 mm in length, and about 20 m$\Omega$ of conductor resistance, whereby the measured value of electric resistance, included an internal conductor resistance of about 100 m$\Omega$.

Next, the filler compositions, initial electric resistance values, and electric resistance values after the filler four times passed the belt furnace in air at a temperature of 850° C., are shown in Table 5.

TABLE 5

| Specimen No. | Filler Composition (w. %) | | | Electric Resistance | |
|---|---|---|---|---|---|
| | Noble Metal Powder | BaO—$B_2O_3$ Series Glass | Alumina Powder | I(m$\Omega$) | II(m$\Omega$) |
| SILVER | | | | | |
| 65 | 60 | 20 | 20 | 100.50 | 105.30 |
| 66 | 70 | 15 | 15 | 100.13 | 103.12 |
| 67 | 80 | 10 | 10 | 100.05 | 102.89 |
| 68 | 90 | 5 | 5 | 100.22 | 108.51 |
| GOLD | | | | | |
| 69 | 75 | 12.5 | 12.5 | 100.28 | 107.69 |
| 70 | 86 | 7 | 7 | 100.31 | 103.94 |
| 71 | 92 | 4 | 4 | 100.19 | 103.50 |
| 72 | 97 | 2 | 1 | 100.15 | 107.89 |
| PLATINUM | | | | | |
| 73 | 75 | 12.5 | 12.5 | 100.89 | 107.88 |
| 74 | 86 | 7 | 7 | 100.19 | 103.28 |
| 75 | 92 | 4 | 4 | 100.11 | 103.29 |
| 76 | 97 | 2 | 1 | 100.05 | 107.48 |
| PALADIUM | | | | | |
| 77 | 60 | 20 | 20 | 102.10 | 109.28 |
| 78 | 70 | 15 | 15 | 101.98 | 108.04 |
| 79 | 80 | 10 | 10 | 101.02 | 105.00 |
| 80 | 90 | 5 | 5 | 100.47 | 107.19 |

As seen from this example, when the internal are about equivalent to those of using tungsten conductor is made of molybdenum, the measurement results. Accordingly, the multilayered thick film structure in this example is also practically usable. In addition, the tables represented typical filler compositions only, but other compositions of filler in the range shown in the example of tungsten internal conductor developed a tendency similar thereto.

Incidentally, the above examples are described by use of test pieces, but the multilayered structure may have the multilayered wiring construction in an actual circuit pattern. Also, the wiring layers may to be laminated in desired number in the unbaked condition and are not limited to the above examples.

Figure 6:
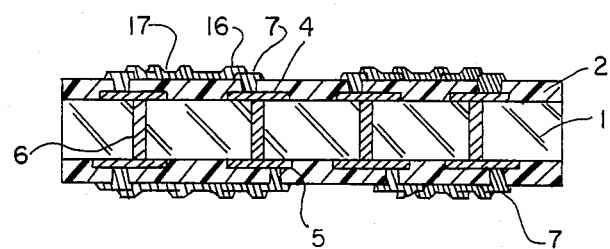
FIG. 6 is a sectional view the multilayered substrate in which both surfaces are constructed to be provided with thick film circuitry thereon.

Furthermore, in the aforesaid examples, the multilayered substrate at one side surface thereof is shown, but construction of multilayered substrate is not limited to the above. Alternatively, the multilayers at both sides of substrate may of course be available. For example, the substrate, as shown in FIG. 6, is connected at both sides through base metal conductors, at each surface are multilayered and sintered the base metal conductors and ceramic insulating layers, fillers are filled into orifices at each uppermost layer, and at both sides, the Ag-Pd thick film conductors and $RuO_2$ series glaze resistors can be formed.

Although the invention has been described with reference to several different embodiments, these embodiments are merely exemplary and not limiting of the invention which is defined solely by the appended claims.

What is claimed is:

1. A multilayered substrate comprising:
   electrical insulating layers of ceramic; and
   internal conductor layers of one base metal of tungsten, molybdenum, copper, nickel and iron, provided between each two of said electrical insulating layers, an uppermost layer of said electrical insulating layers being provided with orifices through which necessary portions at said internal conductor layers are exposed, said orifices at said uppermost insulating layer being filled with a filler material comprising a noble metal and a mixture of $BaO$-$B_2O_3$ series glass and alumina, which mixture is chemically inert to said base metal.

2. The multilayered substrate according to claim 1, wherein said insulating layers comprise ceramic containing alumina as a main constituent and said internal conductor layers comprise tungsten.

3. The multilayered substrate according to claim 1, wherein said noble metal is silver.

4. The multilayered substrate according to claim 1, wherein said noble metal is gold.

5. The multilayered substrate according to claim 1, wherein said noble metal is platinum.

6. A multilayered substrate comprising:
   electrical insulating layers of ceramic;
   internal conductor layers of one base metal of tungsten, molybdenum, copper, nickel and iron, provided between each two layers of said electrical insulating layers;
   thick film components provided on an uppermost layer of said electrical insulating layers; and
   noble metal series thick film conductors provided on said uppermost insulating layer as electrodes of said thick film components,
   said uppermost insulating layer being provided with orifices through which necessary portions of said internal conductor layers are exposed, said orifices being filled with a filler material comprising a noble metal and a mixture of $BaO$-$B_2O_3$ series glass and alumina, which mixture is chemically inert to said base metal, said noble metal series thick film conductors being electrically connected to extended portions of said filler material respectively.

7. The multilayered substrate according to claim 6, wherein said insulating layers comprise ceramic containing alumina as a main constituent.

8. The multilayered substrate according to claim 6, wherein said noble metal is silver.

9. The multilayered substrate according to claim 6, wherein said noble metal is gold.

10. The multilayered substrate according to claim 6, wherein said noble metal is platinum.

11. The multilayered substrate according to claim 6, wherein said noble metal series thick film conductors comprise silver-palladium series conductors.

12. The multilayered substrate according to claim 6, wherein said thick film components comprise $RuO_2$ series glaze resistors.

* * * * *